(12) United States Patent
Rupp et al.

(10) Patent No.: US 6,204,187 B1
(45) Date of Patent: *Mar. 20, 2001

(54) CONTACT AND DEEP TRENCH PATTERNING

(75) Inventors: Thomas S. Rupp, Stormville; Alan Thomas, Hughsonville; Franz Zach, Wappingers Falls, all of NY (US)

(73) Assignee: Infineon Technologies North America, Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/226,434

(22) Filed: Jan. 6, 1999

(51) Int. Cl.[7] .................................................. H01L 21/311
(52) U.S. Cl. ......................... 438/702; 438/700; 438/736; 438/637; 430/312; 430/313; 430/317; 430/394
(58) Field of Search ..................................... 438/736, 702, 438/700, 637, 738, 312, 313, 317, 394

(56) References Cited

U.S. PATENT DOCUMENTS

| | | | |
|---|---|---|---|
| 3,784,380 | * | 1/1974 | Compare ..................................... 96/44 |
| 5,100,508 | * | 3/1992 | Yoshida et al. .................... 156/659.1 |
| 5,227,013 | * | 7/1993 | Kumar ................................... 156/644 |
| 5,354,711 | * | 10/1994 | Heitzmann et al. .................. 437/182 |
| 5,422,205 | * | 6/1995 | Inoue et al. ............................... 430/5 |
| 5,705,321 | * | 1/1998 | Brueck et al. ........................ 430/316 |
| 5,759,744 | * | 6/1998 | Brueck et al. ........................ 430/312 |

* cited by examiner

Primary Examiner—Matthew Smith
Assistant Examiner—Renzo N. Rocchegiani
(74) Attorney, Agent, or Firm—Donald B. Paschburg (57) ABSTRACT

A method for patterning semiconductor components includes the steps of providing a substrate layer, the substrate layer having a dielectric layer formed thereon and a mask layer formed on the dielectric layer, the mask layer being selectively etchable relative to the dielectric layer, patterning the mask layer to form a first group of substantially parallel lines in the mask layer and patterning the dielectric layer to form rectangular holes therein down to the substrate layer. A semiconductor device in accordance with the invention is also included.

21 Claims, 8 Drawing Sheets

CONTACT AND DEEP TRENCH PATTERNING

BACKGROUND

1. Technical Field

This disclosure relates to semiconductor fabrication and more particularly, to an improved method and apparatus for forming contacts.

2. Description of the Related Art

Contact patterning is becoming more and more difficult for lithography with decreasing groundrules. For memory and/or logic chips, such as, dynamic random access memory (DRAM) chips and embedded DRAM chips, sub-micron groundrules may be used, for example. Sub-micron line space patterns can be printed reasonably well with relatively simple image enhancement techniques (e.g., off-axis illumination).

Printing sub-micron contacts is much more difficult, however. Since contact holes are typically formed as individual holes, aberrations and interference patterns occurring during patterning make reliable formation of the contact holes difficult even if advanced techniques such as phase shift masks are used.

The alignment of contacts with conductors, such as metal lines, is important. When contacts and metal lines are smaller in size, alignment becomes even more difficult, and missing a connection between the metal line and the contact as well as shorting out a contact and a neighboring line may be more likely.

Therefore, a need exists for improved contacts for semiconductor devices wherein the contacts may be formed down to the size of the groundrules. A further need exists for a method of forming the improved contacts wherein the risk of misalignment with metal lines is reduced.

SUMMARY OF THE INVENTION

A method for patterning semiconductor components includes the steps of providing a substrate layer, the substrate layer having a dielectric layer formed thereon and a mask layer formed on the dielectric layer, the mask layer being selectively etchable relative to the dielectric layer, patterning the mask layer to form a first group of substantially parallel lines in the mask layer and patterning the dielectric layer to form rectangular holes therein down to the substrate layer.

Another method for patterning semiconductor components, in accordance with the present invention, includes the steps of providing a substrate layer, the substrate layer having a dielectric layer formed thereon, a first mask layer formed on the dielectric layer and a second mask layer formed on the first mask layer, the second mask layer and the dielectric layer being selectively etchable relative to the first mask layer, patterning the second mask layer to form a first group of substantially parallel lines in the second mask layer, patterning the first mask layer to form rectangular holes therein, etching the dielectric layer in accordance with the rectangular holes to form rectangular holes in the dielectric layer and removing remaining portions of the first mask layer and the second mask layer.

Yet another method for patterning semiconductor components includes the steps of providing a substrate layer, the substrate layer having a dielectric layer formed thereon, a first mask layer formed on the dielectric layer, the first mask layer and the dielectric layer being selectively etchable relative to each other, patterning a resist on the first mask layer by forming substantially parallel lines, etching through the first mask layer in accordance with the patterned resist to form a first group of substantially parallel lines in the first mask layer, removing the resist, patterning a second resist on the first mask layer by forming a second group of substantially parallel lines disposed substantially perpendicular to the first group of substantially parallel lines, etching through the dielectric layer in accordance with the patterned second resist and the first group of substantially parallel lines to form rectangular holes in the dielectric layer, removing the second resist and removing remaining portions of the first mask layer.

In other methods in accordance with the present invention, the step of depositing a conductive material in the holes to form contacts to the substrate layer may be included. The substrate layer may include a semiconductor substrate and the method include the step of etching the semiconductor substrate to form deep trenches therein. The method may further include the step of forming the holes into shapes including one of rectangles and squares. The step of forming holes may include the step of forming holes into shapes including one of rectangles and squares wherein at one least side the rectangles and squares includes a minimum feature size of a given technology. The method may further include the steps of independently adjusting a length of the rectangular holes and/or independently adjusting a width of the rectangular holes. The method may further include the steps of etching lines in the dielectric layer corresponding to hole positions and depositing a conductive material in the holes and in the lines for a dual damascene process.

A semiconductor device in accordance with the present invention includes a substrate including contact regions, a dielectric layer disposed on the substrate having rectangular holes disposed therein according to a predetermined pattern and a plurality of rectangular contacts disposed in the rectangular holes for connecting the contact regions of the substrate to a conductive layer disposed on the dielectric layer.

In alternate embodiments, the rectangular contacts have at least one side substantially equal to at least a minimum feature size for a given technology. The rectangular contacts may be squares with sides substantially equal to at least a minimum feature size for the given technology. The contact regions may include diffusion regions and the conductive layer includes bitlines. The dielectric layer may include dual damascene metal lines for electrically connecting to the contacts.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiment with reference to the following figures wherein.

DETAILED DESCRIPTION OF PREFERRED EMBODIMENTS

This disclosure relates to semiconductor fabrication and more particularly, to an improved method and apparatus for forming contacts. The present invention provides a deep trench mask and/or contacts that are formed using different masking materials in a grid formation. The grid may include lines down to a minimum feature size, F, for the technology employed. Contacts are formed in spaces between the masking materials which are formed on different levels. The contacts are advantageously formed in a rectangular or square shape permitting contacts down to the groundrule or minimum feature size. The rectangular or square contact shapes provide increased contact area without corner rounding. Additionally, deep trenches may be etched into a substrate of a semiconductor device by employing the present invention.

Figure 1:
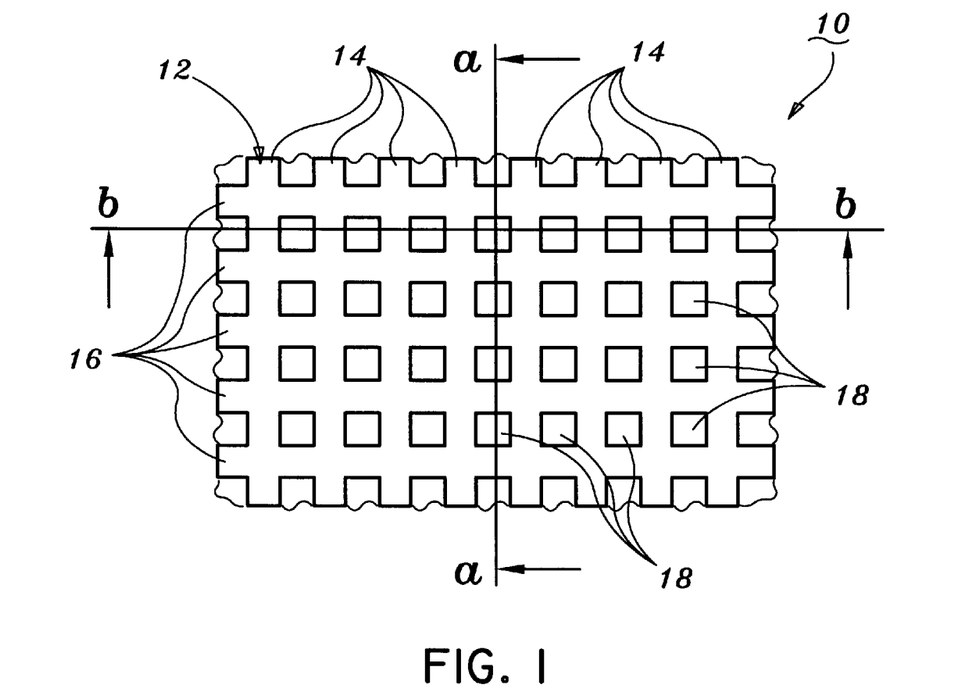
FIG. 1 is a top plan view of a semiconductor device having a grid formed thereon in accordance with the present invention.

Referring now in specific detail to the drawings in which like reference numerals identify similar or identical elements throughout the several views, and initially to FIG. 1, a top view of a semiconductor device 10 is shown having a grid 12 applied thereto in accordance with the present invention. Semiconductor device 10 is shown with upper layers including dielectric layers and conductive layers removed to show grid 12. Grid 12 preferably includes vertical lines 16 and horizontal lines 16 forming rectangles or squares therebetween. Although grid 12 includes rectangles or squares, other configurations and shapes may be formed in accordance with the invention, for example elongated slots, parallelograms, etc. Spaces 18 between vertical lines 14 and horizontal lines 14 may be contact holes for forming contacts between levels on the semiconductor device 10, or grid 12 may be a mask for forming rectangular or square deep trenches.

Figure 2:
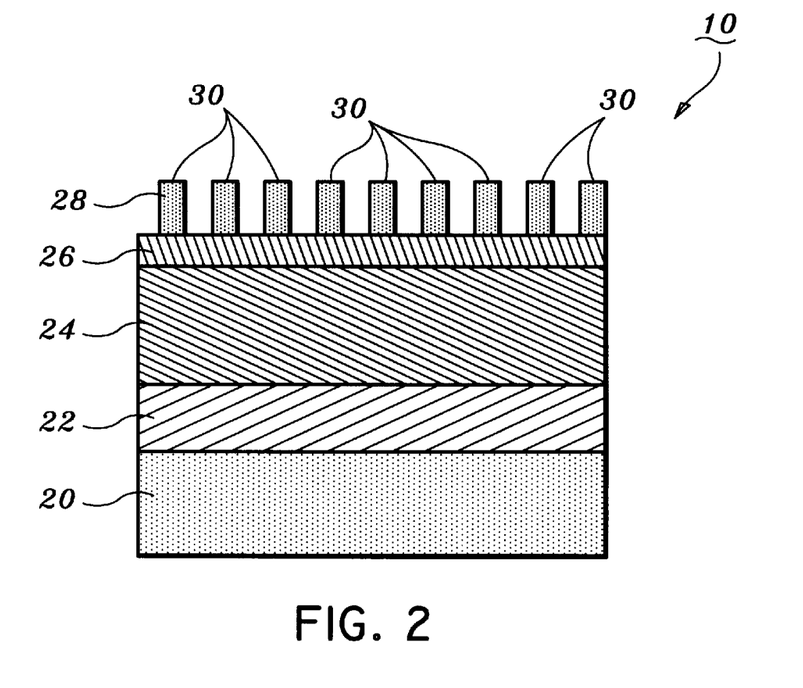
FIG. 2 is a cross-sectional view taken along section line a—a of FIG. 1 during processing of the semiconductor device, the cross-sectional view showing mask layers, a dielectric layer and a resist layer for patterning the grid in accordance with the present invention.
Figure 3:
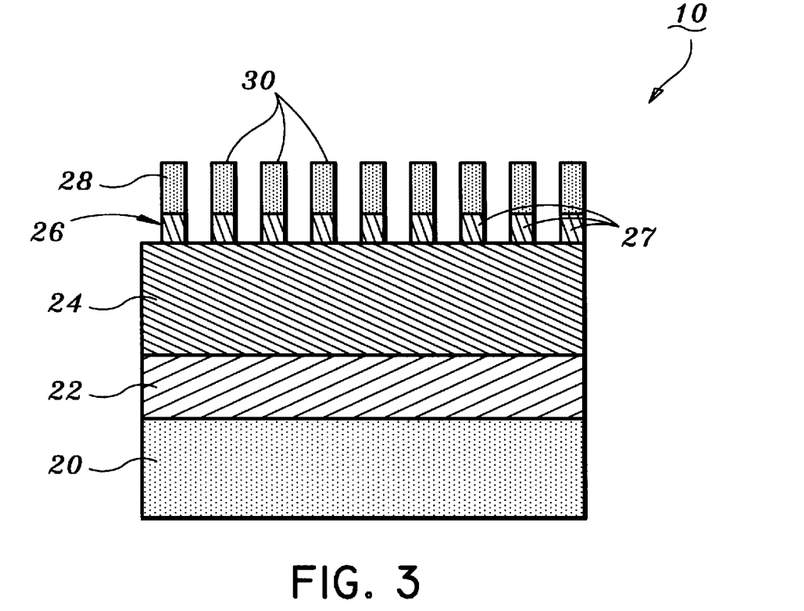
FIG. 3 is a cross-sectional view taken along section line a—a of FIG. 1 during processing of the semiconductor device, the cross-sectional view showing the mask layers being patterned in accordance with the present invention.

It is to be understood that cross-sections of FIGS. 2 and 3 are taken along section line a—a while the cross-sections of FIGS. 4–7 are taken along section line b—b. FIGS. 2–7 show processing steps for the present invention based on the orientation of device 10 of FIG. 1. The individual processing steps are not indicated in FIG. 1.

Referring to FIG. 2, a substrate layer 20 is formed or provided. Substrate layer 20 may include, for example, a semiconductor substrate which is being prepared for the formation of deep trenches therein in accordance with the invention. A dielectric layer 22 is deposited on substrate layer 20. Dielectric layer 22 preferably includes a hardmask layer such as a nitride, for example, silicon nitride. Other materials are also contemplated, for example, an oxide, such as silicon oxide or a glass, such as borosilicate phosphorous glass (BSPG). Dielectric layer 22 may be applied by a low pressure chemical vapor deposition (LPCVD) process. If silicon nitride is used, dielectric layer may be about 10–10,000 nm in thickness, although any thickness of dielectric layer may be used depending on the design of semiconductor device 10.

A mask dielectric layer or mask layer 24 is deposited on dielectric layer 22. Mask layer 24 is preferably selectively etchable relative to dielectric layer 22. Mask layer 24 is patterned as described below to pattern dielectric layer 22. Mask layer 24 is preferably an oxide, such as silicon oxide, if silicon nitride is used for dielectric layer 22. Another mask layer 26 is deposited on mask layer 24. Mask layer 26 is preferably the same material used for dielectric layer 22, however other materials may be used which are selectively etchable relative to mask layer 24. A resist layer 28 is applied on second mask layer 26, exposed and developed preferably by a photolithography process. Resist layer 28 is formed in a predetermined pattern. In a preferred embodiment, the predetermined pattern includes parallel lines having a thickness from about a minimum feature size (F) (i.e, down to the groundrule) to an appropriate upper bound limitation for the design. The pattern includes resist lines 30 as shown. Referring to FIG. 3, mask layer 26 is etched down to mask layer 24 according to the pattern of resist layer 28. This forms a pattern for etching mask layer 24. In a preferred embodiment, a group of substantially parallel lines 27 are formed in second mask layer 26. These lines may be varied in shape according to the resist pattern in resist 28.

Figure 4:
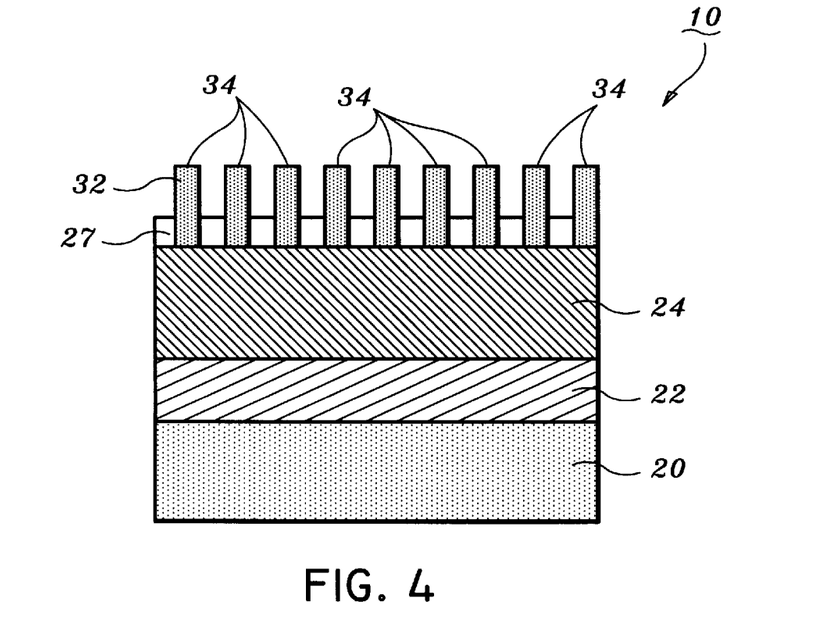
FIG. 4 is a cross-sectional view taken along section line b—b of FIG. 1 during processing of the semiconductor device, the cross-sectional view showing a resist layer for patterning the grid in accordance with the present invention.

Turning to FIGS. 4–7, cross-sectional views are taken along section lines perpendicular to the section lines of FIGS. 2 and 3. Referring to FIG. 4, a resist layer 32 is applied, exposed and developed in a predetermined pattern. In a preferred embodiment, the predetermined pattern includes parallel lines 34 having a thickness from about a minimum feature size (F) (i.e, down to the groundrule) to an appropriate upper bound limitation for the design. In the illustrative embodiment, lines 34 are perpendicular to lines 27, one of which is shown in FIG. 4.

Figure 5:
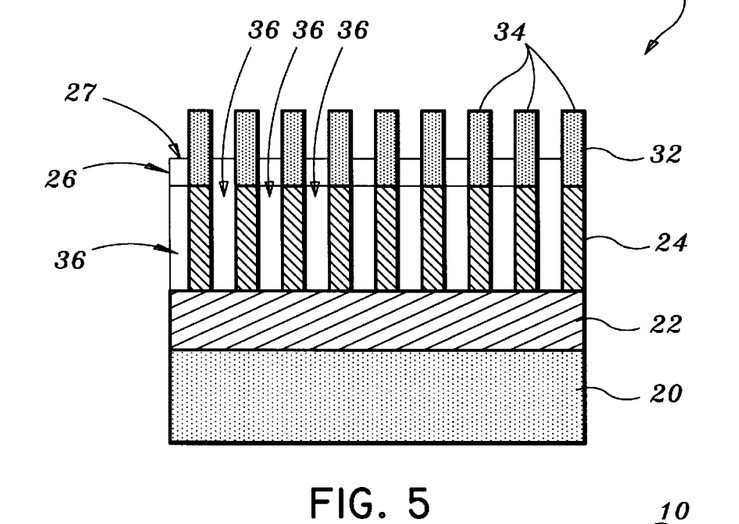
FIG. 5 is a cross-sectional view taken along section line b—b of FIG. 1 during processing of the semiconductor device, the cross-sectional view showing a mask layer patterned in accordance with the present invention.

Referring to FIG. 5, a selective etching process is performed to etch mask layer 24 down to dielectric layer 22. The selective etch process is preferably an isotropic etching process using lines 27 (of second mask layer 26 (FIG. 4)) and lines 34 to form rectangular or square holes 36 shown. Portions of mask layer 24 are removed selective to dielectric layer 26 in accordance with the pattern of resist layer 32.

Figure 6:
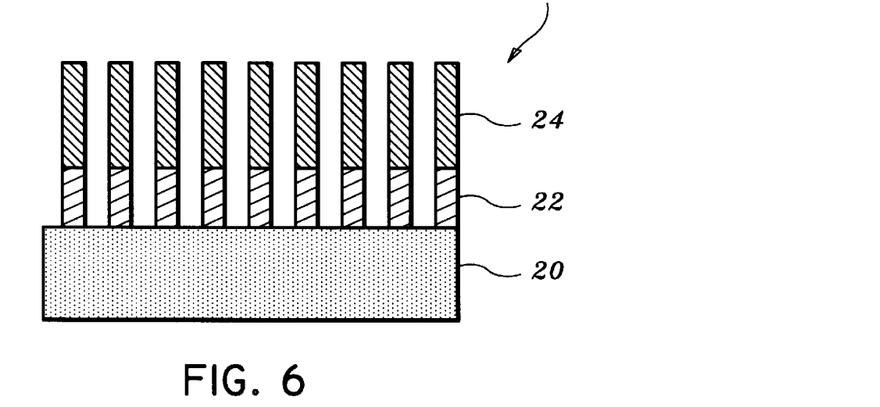
FIG. 6 is a cross-sectional view taken along section line b—b of FIG. 1 during processing of the semiconductor device, the cross-sectional view showing the dielectric layer patterned to form the grid of FIG. 1 in accordance with the present invention.

Referring to FIG. 6, resist layer 32 is stripped from mask layer 24. A selective etching process is performed to transfer the grid pattern formed in the previous steps to dielectric layer 22. During this selective etching process, if the same material is used for mask layer 26 and dielectric layer 22, the remaining portions of mask layer 26 are removed simultaneously with the selective etch of dielectric layer 22.

Figure 7:
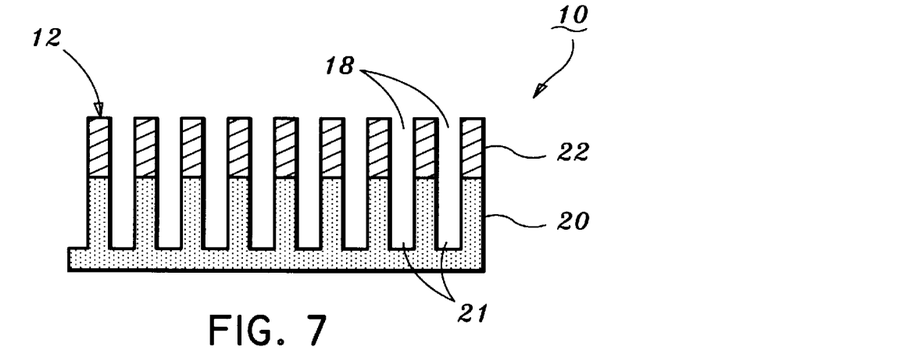
FIG. 7 is a cross-sectional view taken along section line b—b of FIG. 1 during processing of the semiconductor device, the cross-sectional view showing a grid for masking the substrate layer for forming deep trenches in accordance with the present invention.

Referring to FIG. 7, mask layer 24 is removed from dielectric layer 22. Dielectric layer 22 is now patterned such that grid 12 (FIG. 1) is employed for deep trench formation in substrate 20. The grid pattern provided by dielectric layer 22 is preferably employed as a mask to pattern a semiconductor substrate (substrate layer 20), for example to form deep trenches 21 in a DRAM chip, or to provide a pattern or mask for any other features or components to be formed. Dielectric layer 22 is preferably a nitride which provides higher selectivity for etching of deep trenches 21 into substrate 20. Advantageously, the grid pattern described includes rectangular or square holes 18 (see also FIG. 1) for etching rectangular or square deep trenches 21. Deep trenches 21 may be formed having a substantially rectangular or square shape with sides which may be as small as the minimum feature size. The rectangular or square shapes are formed with no corner rounding which advantageously provides increased volume of the trench and independent control of length and width of the trench.

Figure 8:
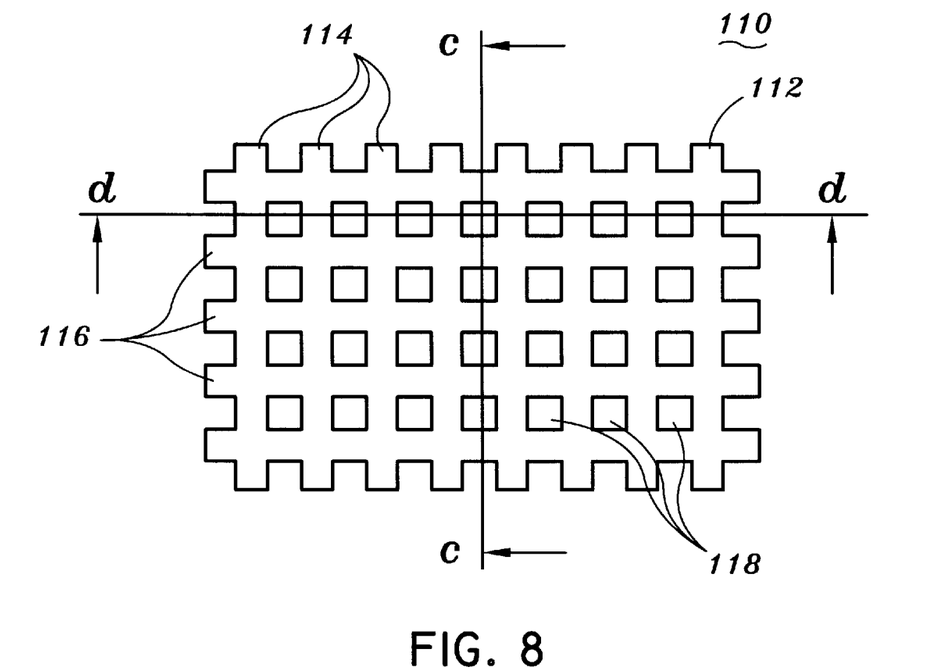
FIG. 8 is a top plan view of a semiconductor device having a grid formed thereon in accordance with the present invention.

Referring to FIG. 8, semiconductor device 110 is shown with upper dielectric layer and conductive layers removed to show grid 112. Grid 112 preferably includes vertical lines 116 and horizontal lines 116 forming rectangles or squares therebetween. Although grid 112 includes rectangles or squares, other configurations and shapes may be formed in accordance with the invention, for example elongated slots, parallelograms, etc. Spaces 118 between vertical lines 114 and horizontal lines 114 may be contact holes for forming contacts between levels on the semiconductor device 110, or grid 112 may be used as a mask for forming rectangular or square deep trenches.

Figure 9:
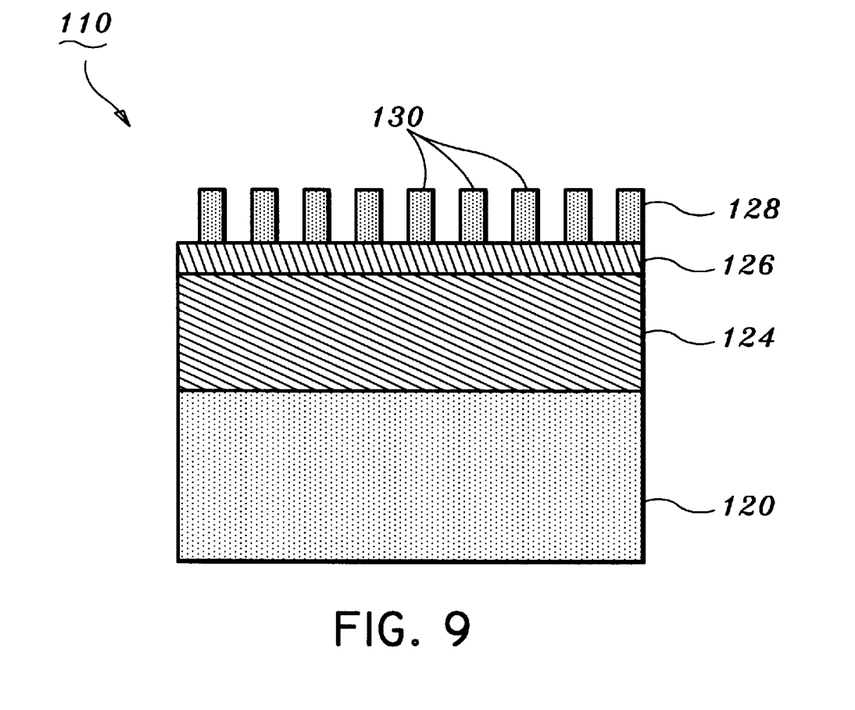
FIG. 9 is a cross-sectional view taken along section line c—c of FIG. 8 during processing of the semiconductor device, the cross-sectional view showing mask layers, and a resist layer for patterning the grid in accordance with the present invention.
Figure 10:
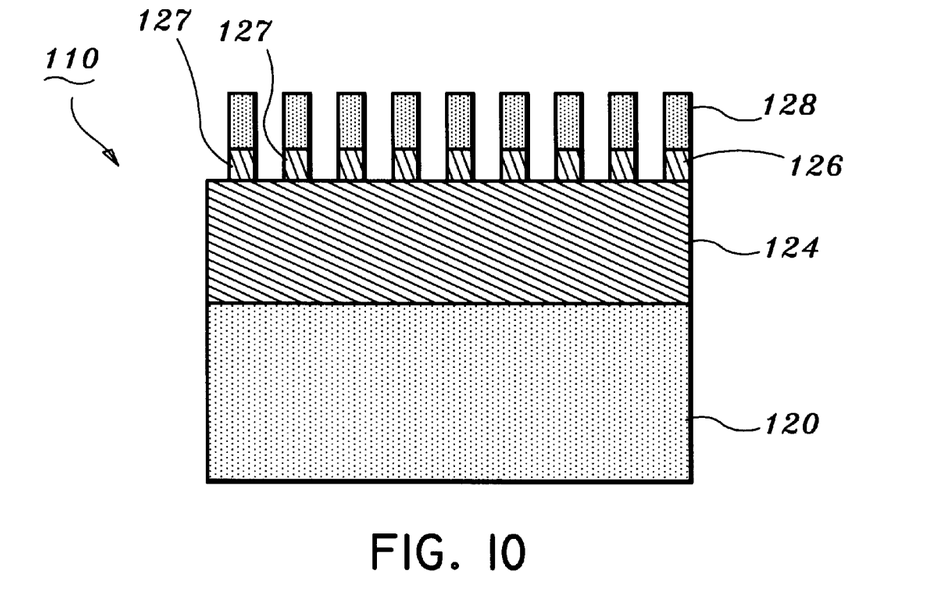
FIG. 10 is a cross-sectional view taken along section line c—c of FIG. 8 during processing of the semiconductor device, the cross-sectional view showing a mask layer being patterned in accordance with the present invention.
Figure 11:
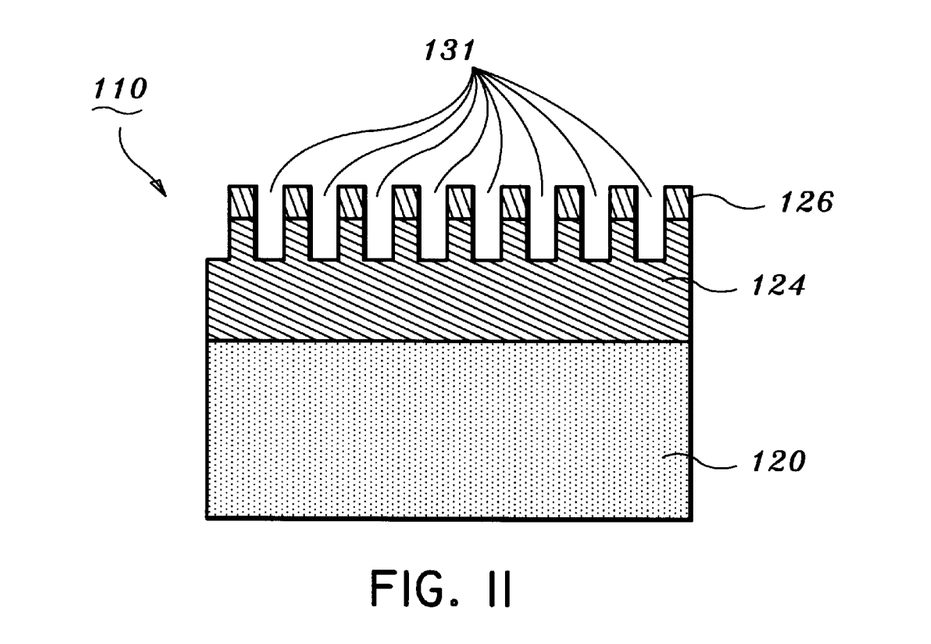
FIG. 11 is a cross-sectional view taken along section line d—d of FIG. 8 during processing of the semiconductor device, the cross-sectional view showing spaces etched to form conductive lines for a dual damascene process in accordance with the present invention.

It is to be understood that cross-sections of FIGS. 9 through 11 are taken along section line c—c while the cross-sections of FIGS. 12–15 are taken along section line d—d. FIGS. 9–15 show processing steps for the present invention based on the orientation of device 110 of FIG. 8. The individual processing steps are not indicated in FIG. 8.

Referring to FIG. 9, a substrate layer 120 is formed or provided. Substrate layer 120 may include, for example, a semiconductor substrate having diffusion regions formed therein which are to be connected to metal lines by contacts to be formed in accordance with the invention.

A dielectric layer 124 is deposited on substrate 120. Dielectric layer 124 is preferably an oxide, such as silicon. A mask layer 126 is deposited on dielectric layer 124. Mask layer 126 is preferably selectively etchable relative to dielectric layer 124. A resist layer 128 is applied on mask layer 126, exposed and developed preferably by a photolithography process. Resist layer 128 is formed in a predetermined pattern. In a preferred embodiment, the predetermined pattern includes parallel lines 130 having a thickness from about a minimum feature size (F) (i.e, down to the groundrule) to an appropriate upper bound limitation for the design. Referring to FIG. 10, mask layer 126 is etched down to dielectric layer 124 according to the pattern of resist layer 128. This forms a pattern for etching dielectric layer 124. In a preferred embodiment, a group of substantially parallel lines 127 are formed in mask layer 126. These lines 127 may be varied in shape according to the resist pattern in resist 128. Referring to FIG. 11, in one embodiment, resist 128 is removed and dielectric layer 124 is etched to form spaces 131 for a damascene metal line to be deposited therein in later steps.

Figure 12:
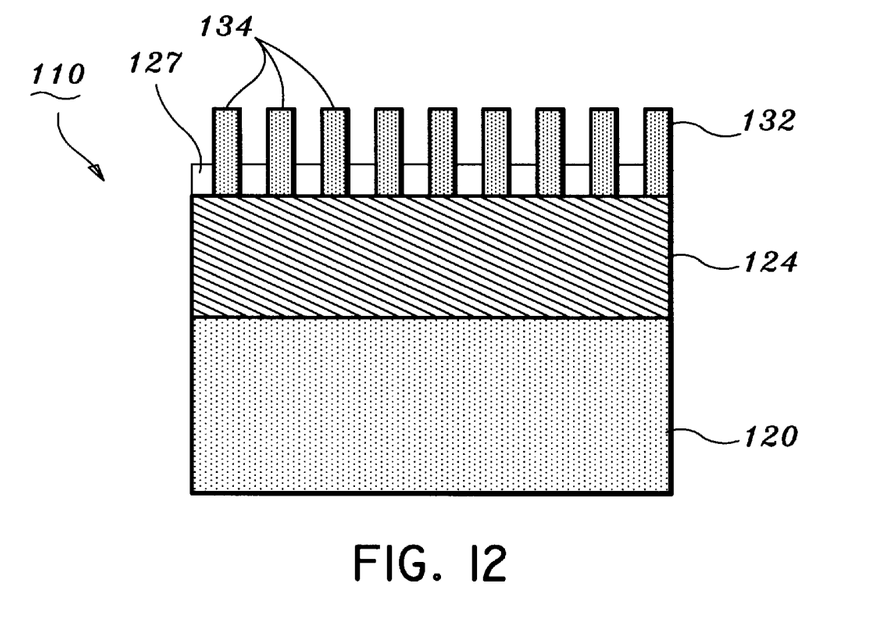
FIG. 12 is a cross-sectional view taken along section line d—d of FIG. 8 during processing of the semiconductor device, the cross-sectional view showing a second resist layer for patterning the grid in accordance with the present invention.

Turning to FIGS. 12–15, cross-sectional views are taken along section lines perpendicular to the section lines for FIGS. 9, 10 and 11. Referring to FIG. 12, a resist layer 132 is applied, exposed and developed in a predetermined pattern. In a preferred embodiment, the predetermined pattern includes parallel lines 134 having a thickness from about a minimum feature size (F) (i.e, down to the groundrule) to an appropriate upper bound limitation for the design. In the illustrative embodiment, lines 134 are perpendicular to lines 127, one of which is shown in FIG. 12.

Figure 13:
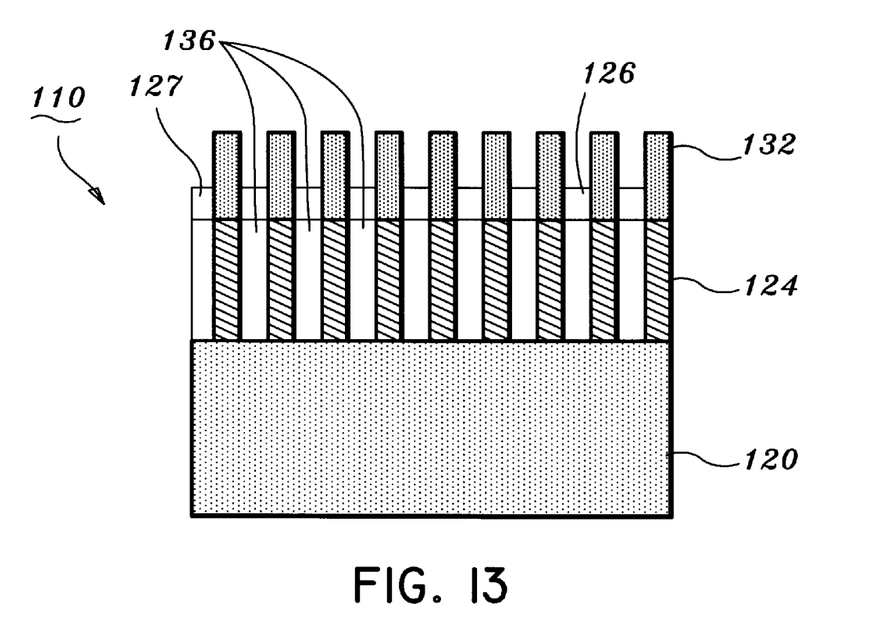
FIG. 13 is a cross-sectional view taken along section line d—d of FIG. 8 during processing of the semiconductor device, the cross-sectional view showing a mask layer patterned in accordance with the present invention.

Referring to FIG. 13, a selective etching process is performed to etch dielectric layer 124 down to substrate 120. The selective etch process is preferably an isotropic etching process such that lines 127 (of mask layer 126 (FIG. 10) and lines 134 form rectangular or square holes 136 as shown. Resist lines in layer 132 are formed to protect the portions of dielectric layer 124 therebelow from the etching process.

Figure 14:
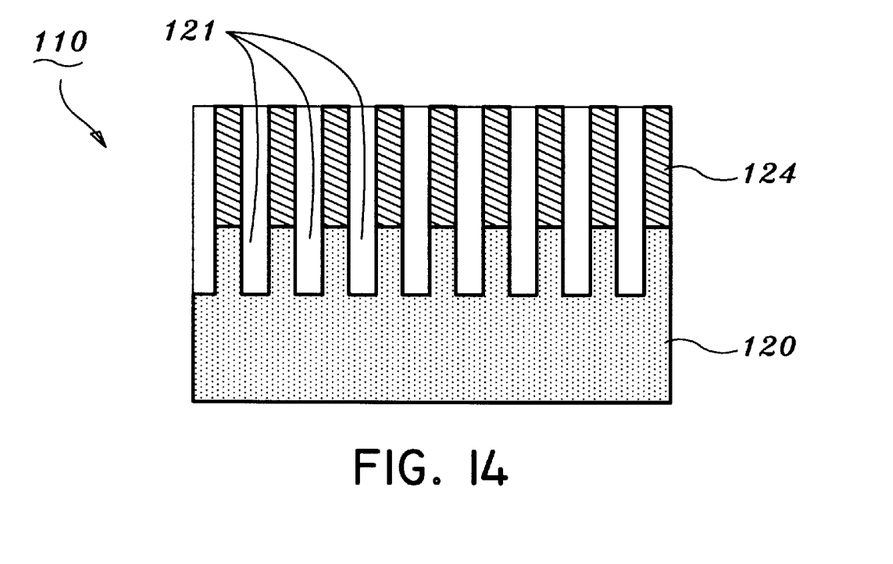
FIG. 14 is a cross-sectional view taken along section line d—d of FIG. 8 during processing of the semiconductor device, the cross-sectional view showing the substrate layer patterned to form deep trenches in accordance with the present invention.

Referring to FIG. 14, resist layer 132 is stripped from dielectric layer 124 and mask layer 126. Mask layer 126 may also be stripped away. In one embodiment, substrate layer 120 may be etched to form deep trenches 121 without the use of an additional mask layer (i.e. dielectric layer 22).

Figure 15:
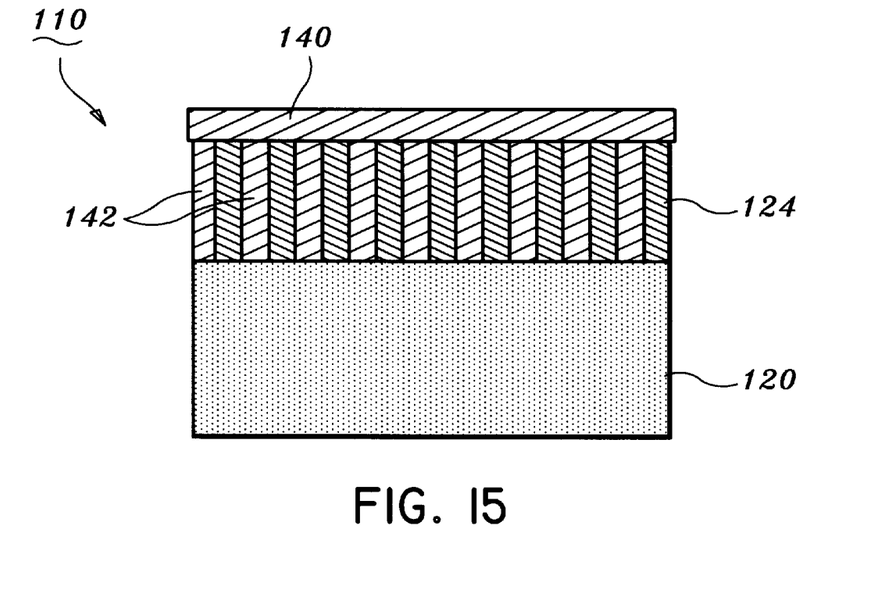
FIG. 15 is a cross-sectional view taken along section line d—d of FIG. 8 during processing of the semiconductor device, the cross-sectional view showing contacts and conductive lines formed in accordance with the present invention.

Referring to FIG. 15, forming conductive lines 140, such as bitlines or other conductors and contacts 142, such as bitline contacts, surface strap contacts or capacitor contacts may be formed simultaneously in a dual damascene process, or contacts 142 and conductive line 140 may be formed using different process steps. Substrate layer 120 may include conductive or metal lines of a lower layer to be connected to metal lines of a higher layer by contacts 142 formed in accordance with the invention. Further processing may continue as is known in the art to form remaining components of the semiconductor device. The present invention may be employed many times in the fabrication of a single semiconductor device, for example, the grid pattern including dielectric layer 124 of FIG. 14 may be used to form deep trenches 121 directly in substrate 120 as shown in FIG. 14. The invention may then be employed to form bitline contacts and still later be used to form interconnects between metal lines.

Figure 16:
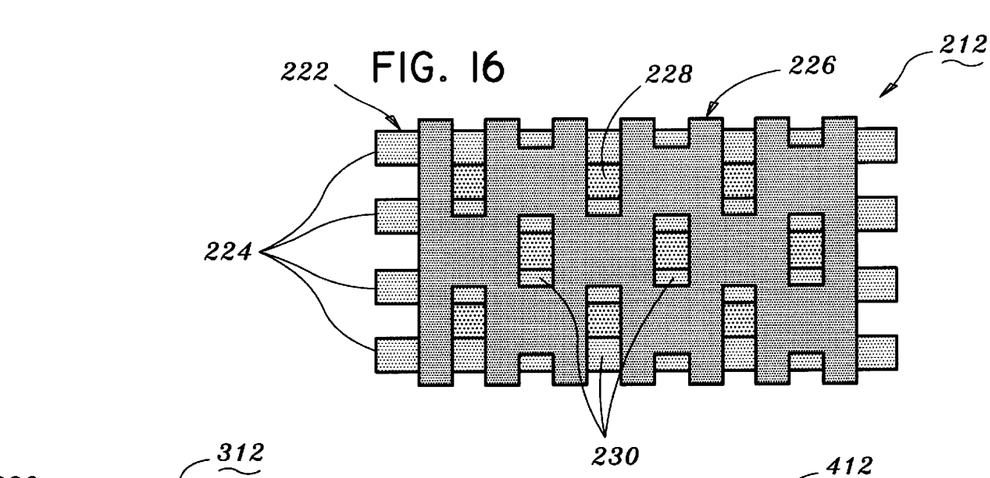
FIG. 16 is a plan view of a grid having holes spaced at a distance of three times the minimum feature size for a given technology in accordance with the present invention.
Figure 17:
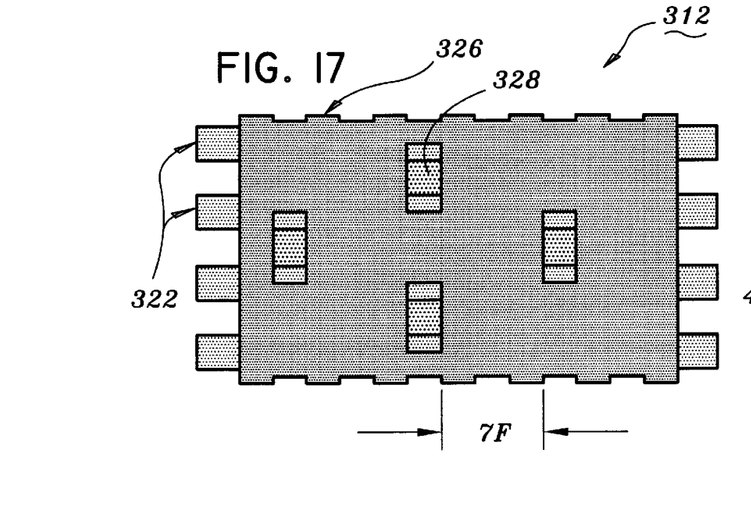
FIG. 17 is a plan view of a grid having holes spaced at a distance of seven times the minimum feature size for a given technology in accordance with the present invention.
Figure 18:
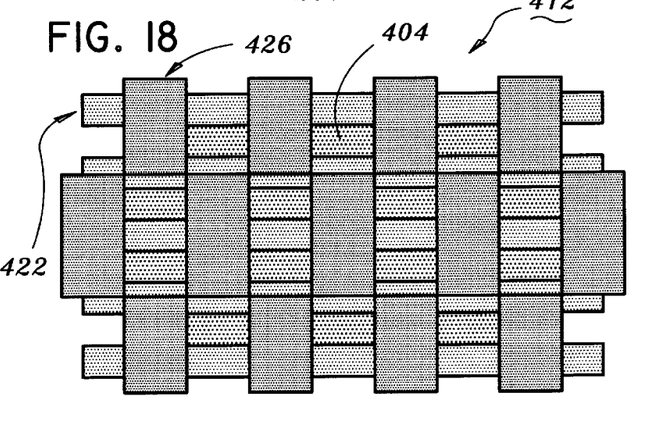
FIG. 18 is a plan view of a grid having holes spaced at a distance of eight times the minimum feature size squares for a given technology in accordance with the present invention.

Referring to FIGS. 16–18, other configurations for contacts and deep trenches are illustratively shown. In FIG. 16, a dielectric layer (or mask layer) 222 is shown having lines 224 in a first direction. A resist 226 is applied in line segments to form a grid 212 for forming contact holes (or etching positions) 228. Contact holes 228 are provided for a semiconductor device at a distance of about 3 times the minimum feature size (3 F) therebetween. In this way, when contacts are formed therein, a greater distance is provided between the contacts. This may be adjusted in accordance with the design of semiconductor device by changing resist patterns, etc. Advantageously, contact holes and/or etching positions are rectangular in shape. Further, the contact hole or etching positions may afford a greater tolerance for aligning resist 226 in the vertical direction since slots 230 may overlap onto the lines of dielectric layer 222. Changes in the predetermined resist patterns 226 may provide greater distances between contact holes/etching positions 228 or provide larger shapes. In FIG. 17, a grid 312 is shown having a pattern including dielectric layer 322 and resist 326 where contact holes (or etching positions) 328 are 7 F apart. This arrangement is similar to bitline contacts for configurations for DRAM chips having cell areas of $8 \cdot F^2$. As demonstrated, other distances between contact holes/etching positions 228 and 328 may be provided. The design is not limited to an integral number of feature sizes; instead, any sized grid spacing is possible above the minimum feature size, F, in accordance with the invention.

In other configurations, as shown in FIG. 18, a deep trench configuration, for example, for cell areas of $8 \cdot F^2$, may be formed using a grid 412 as a mask for the trench etching process for deep trenches 404 for a DRAM chip, for example. Trenches 404 are formed by adjusting resist 426 and mask layer 422 patterns and using the process described above in accordance with the present invention. FIGS. 16–18 show parallel lines formed prior to (below) grid layer; however, grid layer may be formed first (and below) parallel lines.

Having described preferred embodiments for improved contact and deep trench formation for semiconductor devices (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for patterning semiconductor components comprising the steps of:

providing a substrate layer, the substrate layer having a dielectric layer formed thereon and a mask layer formed on the dielectric layer, the mask layer being selectively etchable relative to the dielectric layer;

patterning the mask layer to form a first group of substantially parallel lines in the mask layer;

patterning a resist layer to form a second group of substantially parallel lines disposed perpendicular to the first group of substantially parallel lines; and etching through the dielectric layer in accordance with the resist layer and the first group of substantially parallel lines of the mask layer to form rectangular holes in the dielectric layer.

2. The method as recited in claim 1, further comprising the step of depositing a conductive material in the holes to form contacts to the substrate layer.

3. The method as recited in claim 1, wherein the substrate layer includes a semiconductor substrate and the method further comprising the step of etching the semiconductor substrate to form deep trenches therein.

4. The method as recited in claim 1, further comprising the step of forming the holes into squares.

5. The method as recited in claim 4, wherein the step of forming holes includes the step of forming holes into shapes including one of rectangles and squares wherein at least one side of the rectangles and squares includes a feature size down to a groundrule for a given technology.

6. The method as recited in claim 1, further comprising the step of adjusting the patterning to form the holes with different sizes.

7. The method as recited in claim 1, further comprising the step of adjusting the patterning to provide different hole patterns.

8. The method as recited in claim 1, further comprising the steps of:

etching lines in the dielectric layer corresponding to hole positions; and depositing a conductive material in the holes and in the lines.

9. A method for patterning semiconductor components comprising the steps of:

providing a substrate layer, the substrate layer having a dielectric layer formed thereon, a first mask layer formed on the dielectric layer and a second mask layer formed on the first mask layer, the second mask layer and the dielectric layer being selectively etchable relative to the first mask layer;

patterning the second mask layer to form a first group of substantially parallel lines in the second mask layer;

patterning a resist layer to form a second group of substantially parallel lines disposed perpendicular to the first group of substantially parallel lines; and etching through the first mask layer in accordance with the resist layer and the first group of substantially parallel lines of the second mask layer to form rectangular holes in the dielectric layer;

etching the dielectric layer in accordance with the rectangular holes to form rectangular holes in the dielectric layer down to the substrate layer; and removing remaining portions of the first mask layer and the second mask layer.

10. The method as recited in claim 9, wherein the substrate layer includes a semiconductor substrate and the method further comprising the step of etching the semiconductor substrate to form deep trenches therein in accordance with the rectangular holes formed in the dielectric layer.

11. The method as recited in claim 9, further comprising the step of forming the rectangular holes into squares.

12. The method as recited in claim 9, wherein the step of etching the dielectric layer in accordance with the rectangular holes to form rectangular holes in the dielectric layer includes the step of forming holes into shapes including one of rectangles and squares wherein at least one side of the rectangles and squares includes a feature size down to a groundrule of a given technology.

13. The method as recited in claim 9, further comprising the step of independently adjusting a length of the rectangular holes.

14. The method as recited in claim 9, further comprising the step of independently adjusting a width of the rectangular holes.

15. A method for patterning semiconductor components comprising the steps of:

provinding a substrate layer, the substrate layer having a dielectric layer formed thereon, a first mask layer formed on the dielectric layer, the first mask layer and the dielectric layer being selectively etchable relative to each other;

patterning a resist on the first mask layer by forming substantially parallel lines;

etching through the first mask layer in accordance with the patterned resist to form a first group of substantially parallel lines in the first mask layer;

removing the resist;

patterning a second resist on the first mask layer by forming a second group of substantially parallel lines disposed substantially perpendicular to the first group of substantially parallel lines;

etching through the dielectric layer in accordance with the patterned second resist and the first group of substantially parallel lines to form rectangular holes in the dielectric layer down to the substrate layer;

removing the second resist; and removing remaining portions of the first mask layer.

16. The method as recited in claim 15, further comprises the step of depositing a conductive material in the rectangular holes to form contacts to the substrate layer.

17. The method as recited in claim 15, wherein the substrate layer includes a semiconductor substrate and the method further comprising the step of etching the semiconductor substrate to form deep trenches therein in accordance with the rectangular holes formed in the dielectric layer.

18. The method as recited in claim 15, further comprising the step of forming the rectangular holes into squares.

19. The method as recited in claim 15, wherein the rectangular holes are formed into shapes including one of rectangles and squares wherein at least one side of the rectangles and squares includes a feature size down to a groundrule of a given technology.

20. The method as recited in claim 15, further comprising the step of independently adjusting a length of the rectangular holes.

21. The method as recited in claim 15, further comprising the step of independently adjusting a width of the rectangular holes.

* * * * *